United States Patent
Severson et al.

(10) Patent No.: US 8,773,200 B2
(45) Date of Patent: Jul. 8, 2014

(54) DECOUPLING CIRCUITS FOR FILTERING A VOLTAGE SUPPLY OF MULTIPLE POWER AMPLIFIERS

(71) Applicant: R2 Semiconductor, Inc., Sunnyvale, CA (US)

(72) Inventors: Cory Severson, Coarsegold, CA (US); Ravi Ramachandran, San Jose, CA (US); David Fisher, Menlo Park, CA (US)

(73) Assignee: R2 Semiconductor, Inc., Sunnyvale, CA (US)

( * ) Notice: Subject to any disclaimer, the term of this patent is extended or adjusted under 35 U.S.C. 154(b) by 53 days.

(21) Appl. No.: 13/674,042

(22) Filed: Nov. 11, 2012

(65) Prior Publication Data
US 2014/0009226 A1    Jan. 9, 2014

Related U.S. Application Data

(60) Provisional application No. 61/669,094, filed on Jul. 8, 2012.

(51) Int. Cl.
*H03F 1/30*    (2006.01)

(52) U.S. Cl.
USPC .......................... 330/127; 330/297

(58) Field of Classification Search
CPC .................. H03F 1/30; H03F 1/303
USPC ........................ 330/127, 199, 297
See application file for complete search history.

(56) References Cited

U.S. PATENT DOCUMENTS

| | | | |
|---|---|---|---|
| 6,993,087 B2 | 1/2006 | Rosnell et al. | |
| 7,064,605 B2 | 6/2006 | Westwick et al. | |
| 7,557,551 B1* | 7/2009 | Somerville et al. | 323/282 |
| 7,675,364 B2 | 3/2010 | Westwick et al. | |
| 7,848,715 B2 | 12/2010 | Boos | |
| 7,894,545 B1 | 2/2011 | Groe | |
| 7,924,937 B2 | 4/2011 | Norsworthy et al. | |
| 8,149,742 B1 | 4/2012 | Sorsby | |
| 2002/0097085 A1 | 7/2002 | Stapleton | |

(Continued)

FOREIGN PATENT DOCUMENTS

WO    WO 2009/139680    11/2009

OTHER PUBLICATIONS

K. Takahashi, S. Yamanouchi, T. Hirayama and K. Kunihiro, IEEE Radio Frequency Integrated Circuits Symposium 2008 p. 405, An Envelope Tracking Power Amplifier using an Adaptive Biased Envelope Amplifier for WCDMA Handsets.

(Continued)

*Primary Examiner* — Steven J Mottola
(74) *Attorney, Agent, or Firm* — Brian R. Short

(57) ABSTRACT

Embodiments for at least one method and apparatus of a voltage supply are disclosed. One voltage supply apparatus includes a voltage supply, a plurality of power amplifier (PA) decoupling circuits, and a plurality of power amplifiers. Each PA decoupling circuit is connected to the voltage supply and provides a filtered voltage supply to a corresponding one of the plurality power amplifiers. Each PA decoupling circuit configured to suppress noise of the provided filtered voltage supply below a threshold at one or more selected frequencies, wherein the suppression is provided by the PA decoupling circuit operating in conjunction with at least one other of the plurality of PA decoupling circuits.

18 Claims, 12 Drawing Sheets

(56) References Cited

U.S. PATENT DOCUMENTS

| | | |
|---|---|---|
| 2006/0178119 A1 | 8/2006 | Jarvinen |
| 2008/0003950 A1 | 1/2008 | Haapoja et al. |
| 2011/0312287 A1 | 12/2011 | Ramachandran et al. |
| 2012/0021704 A1 | 1/2012 | Chan et al. |
| 2012/0049953 A1 | 3/2012 | Khlat |
| 2012/0139641 A1 | 6/2012 | Kaczman |
| 2012/0154054 A1 | 6/2012 | Kaczman |

OTHER PUBLICATIONS

H. du Toit Mouton and B. Putzeys, IEEE Trans Power Elect v 27 p. 2116 (2012), Understanding the PWM Nonlinearity Single-Sided Modulation.

Hoyerby, M. and Andersen, M., IEEE Transactions on Microwave Theory and Techniques v. 57, p. 1687 (2009), TEDS Base-Station Power Amplifier Using Low-Noise Envelope Tracking Power Supply.

W. Chu, B. Bakkaloglu, and S. Kiaei, ISSCC 2008 paper 24.8, A 10MHz-Bandwidth 2mV/Ripple PA Supply Regulator for CDMA Transmitters.

L. Jakobsen and M. Andersen, 29th International Telecommunications Energy Conference (INTELEC 2007) p. 636, Digitally Controlled Envelope Tracking Power Supply for an RF Power Amplifier.

D. Bormann, S. Kaehlert, L. Liao, M. Wei, T. werth, R. Wunderluch and S. Heinen, Proc Asia-Pacific Microwave Conference 2011 p. 498, A Multiband Multistandard Notch Filter LNA for LTE, WCDMA, and GSM for SAW-less Frontends.

L. Edelman, 1988 International Symposium on Electromagnetic Compatibility, p. 334, Control of Power Supply Ripple Produced Sidebands in Microwave Transistor Amplifiers.

A. Ghaffari, E. Klumperink and B. Nauta, ISSCC 2012 paper 4.2, 8-Path Tunable RF Notch Filters for Blocker Suppression.

M. Hassan, L. Larson, V. Leung and P. Asbeck, IEEE 12th Topical Meeting on Silicon Monolithic Integrated Circuits in RF Systems (SiRF), 2012, p. 187, Effect of Envelope Amplifier Nonlinearities on the Output Spectrum of Envelope Tracking Power Amplifiers.

H. Huang, J. Bao and L. Zhang, IEEE Trans Power Elect v 26 p. 1205, A MASH-Controlled Multilevel Power Converter for High-Efficiency RF Transmitters, Apr. 2011.

T. Ito, M. Kanemaru, S. Furuya, D. Huy, K. Okada and A. Matsuzawa, Proc 40th European Microwave Conference, 2010, p. 1118, A 0.8-1.5 GHz Multi-Standard WCDMA Receiver with an Inter-stage Tunable Notch Filter.

PCT, Notification of Transmittal of the International Search Report and the Written Opinion of the International Searching Authority, or the Declaration, International Application No. PCT/US2013/045136, International Filing Date Jun. 11, 2013.

Hoyerby, APEC 2006 p. 993, Envelope Tracking Power Supply with fully controlled 4th order Output Filter.

Lopez, IEEE J. Solid-State Circuits v. 44 p. 2276 (2009), Design of Highly Efficient Wideband Rf Polar Transmitters Using the Envelope-Tracking Technique.

M. Hassan, L. Larson, V. Leung and P. Asbeck, IEEE 12th Topical Meeting on Silicon Monolithic Integrated Circuits in RF Systems (SiRF), 2012, p. 187, Effect of Envelope Amplifier Nonlinearities on the Output Spectrum of Envelope Tracking Power Amplifiers, Apr. 2011.

H. Huang, J. Bao and L. Zhang, IEEE Trans Power Elect v 26 p. 1205, A MASH-Controlled Multilevel Power Converter for High-Efficiency RF Transmitters.

T. Ito, M. M Kanemaru, S. Furuya, D. Huy, K. Okada and A. Matsuzawa, Proc 40th European Microwave Conference, 2010, p. 1118, A 0.8-1.5 GHz Multi-Standard WCDMA Receiver with an Inter-stage Tunable Notch Filter.

J. Ryu, D. Kim, J. Kim, H. Kim, and J. Park, Proc Asia-Pacific Microwave Conf 2011 p. 1818, The Effects of Decoupling Capacitors in DC Bias Lines by Measuring an Implemented RF System.

* cited by examiner

DECOUPLING CIRCUITS FOR FILTERING A VOLTAGE SUPPLY OF MULTIPLE POWER AMPLIFIERS

RELATED APPLICATIONS

This patent application claims priority to U.S. Provisional Patent Application 61/669,094, filed Jul. 8, 2012, which is herein incorporated by reference.

BACKGROUND

Communications radios, such as those employed in mobile cellular handsets and similar devices, generally consist of a transmitter and receiver. The transmitter and receiver are active simultaneously when a full-duplex communications standard is employed. The transmitter in a mobile radio device is generally power-controlled, so that the resulting power in the transmitted signal is just sufficient to be received and decoded at the basestation. In addition, modern communications standards typically employ modulations with a substantial variation in transmitted amplitude from one symbol to the next: that is, the peak-to-average power ratio (also known as the crest factor) is much greater than 1. When transmission occurs at high average power with high peak-to-average ratio, substantial advantages in overall efficiency can be obtained by varying the voltage supplied to the power amplifier in synchrony with the amplitude of the transmitted signal; this approach is generally known as Envelope Tracking (ET) when the power amplifier is operating in a substantially linear regime, or Polar Modulation when the power amplifier is fully saturated.

Envelope Tracking operation requires that the power supply for the RF power amplifier adapt its output rapidly. For example, in WCDMA operation, a chip lasts approximately 260 nsec, so a new optimal output voltage may be required as often as four times per microsecond. Even higher rates may be required in the Long-Term Evolution (LTE) standard. Envelope Tracking power supplies are typically constructed using either a linear amplifier, a hybrid combination of a slow switched power supply and a fast linear amplifier, or a switched power supply with very high switching frequency and control bandwidth.

A fast switched power supply will produce noise at the switching frequency and its harmonics; any phase noise in the switching frequency is multiplied by the order of the harmonic. In addition, for a switched ET supply, envelope modulation of the PWM (pulse-width modulated) signal results in spectral spreading of the switching frequency and its harmonics, as described, for example, by du Toit Mouton and Putzeys. The fundamental is (roughly) spread by the envelope bandwidth, and spreading at the higher harmonics increases linearly with the harmonic multiple n. Finally, some broadband thermal and (1/f) noise is expected to be present, primarily from the switching edges, which being abrupt contain a broad discrete frequency spectrum, spread by any dither present in the switch timing. When the switches are fully on or fully off, little noise is generated.

The radio receiver must be capable of receiving very small signals with small relative bandwidth, and is thus sensitive to periodic disturbances of any kind whose frequency lies within the wanted received channel. In full-duplex operation, where a transmitter sends signals in one band at the same time that a receiver is trying to receive signals in a paired channel of a second band, the transmit and receive frequencies vary, but the frequency separation between the transmit and receive channels is generally a fixed value, $f_{duplex} = f_{RX} - f_{TX}$. (Note that in most cases the mobile unit transmits in the lower and receives in the higher of the paired frequency bands. In a few cases, such as bands 13, 14, and 20 of the 3GPP Technical Specification 36.101, the receive band (channel) is lower than the transmit band (channel). Since most nonlinear mixing processes produce roughly equal mixing products at the sum and difference of the carrier and modulating frequency, the discussion below generally applies to either approach to allocating transmit and receive bands.) When transmission and reception are simultaneously occurring, signals present in the transmit chain may result in desensitization of the receiver. A spurious signal from the transmitter at the frequency the receiver is tuned to may impair the ability to recognize and decode the wanted signal. Extremely small spurious signals can cause problems. For example, consider a WCDMA receiver with sensitivity is limited by thermal noise. The signal bandwidth is about 3.8 MHz, so thermal noise entering the receiver at room temperature is about $-174$ dBm/Hz+66 dB$\approx-108$ dBm. If the receiver noise figure is 8 dB, the noise floor in the receiver channel is about $-100$ dBm (that is, $10^{-13}$ Watts). Any spurious signal comparable to or larger than $-100$ dBm will degrade receiver sensitivity; the total power of added noise and spurious signals should be on the order of 10 dB below the receiver noise floor to achieve <1 dB of degradation in sensitivity. Since the transmitted signal may be as high as 30 dBm or higher, avoiding desensitization requires that noise resulting from the transmit chain be attenuated to $-140$ dB below the transmitted carrier ($-140$ dBc) at the receiver input.

Undesired spurious transmit signals can result when broadband noise undergoes nonlinear mixing with the carrier frequency, resulting in sum and difference frequencies which may overlap the paired receive channel. Sources of broadband noise, as noted above, include amplified thermal noise and switch clock jitter. FIG. 1 shows a transmitter power amplifier 115 and a Low-Noise receiver amplifier 135 of a transceiver, in which the transmitter power amplifier is powered by an envelope tracking power supply, and depicts the problem described above. Noise from an envelope tracking power supply 110, with a spectrum shown in inset 155, mixes with the intended output of the power amplifier 115 to produce an output spectrum containing both the wanted signal, and spurious signals at the sum and difference of the carrier and noise frequencies. An example portion of the spectrum showing spurious output at the sum of the carrier and noise frequencies is depicted in the inset 160. When the spurious output is displaced upwards from the carrier ($F_{TX}$) by the duplex frequency ($f_{duplex}$), as depicted in 160, the spurious frequency lies on top of the paired receive channel for the phone. This noise is partially rejected by the transmit band filter or duplexer, such as 120. Since the spurious frequency is within the intended receive band, it is not rejected by the receive band filter 130 and enters the Low-Noise Amplifier 135, where it may interfere with the wanted signal in the assigned receive channel. This interference results in desensitization of the Receiver 140 to the wanted signal. The transceiver further includes a transmitter 150, baseband circuitry 145, and an antenna 125. Further, a battery is connected to the envelope tracking power supply 110.

Noise that is not exactly at the duplex frequency may still lead to desensitization in the case where the bandwidth of the transmitted and received signals is a substantial fraction of the duplex separation. FIG. 2A shows a frequency domain that depicts an example, in which a receive channel is placed above a transmit channel by the duplex frequency $f_{duplex}$. A transmitted signal 210 of bandwidth BW may mix with noise at frequency $f_{noise}$ to create spurious output 230 over a range of frequencies BW or larger. If this spurious output overlaps the paired channel 240, desensitization may result even though $f_{noise}$ is as much as BW less than $f_{duplex}$. For example, the Frequency-Division-Duplex (FDD) version of the Long-Term Evolution (LTE) physical layer allows channel bandwidths, BW, of as much as 20 MHz.

Modern multicarrier communications systems may also allocate specific subcarrier regions (resource blocks) to specific uplink and downlink users. Thus, it is possible for a mobile radio to be assigned a transmit resource block 5 or even 10 MHz above the center of the transmit channel, and a receive resource block 5 or 10 MHz below the center of the receive channel. FIG. 2B shows another frequency domain that depicts an example wherein a resource block or blocks 250, centered above a nominal carrier 200, may be allocated to the mobile unit's transmitter, while a resource block or blocks 280 centered below the nominal duplex carrier may be allocated to the same mobile unit's receiver. Mixing with noise at frequency $f_{noise} < f_{duplex}$ then produces transmit spurious output 270, overlapping the wanted received signal in the allocated resource block 280. Noise entering the Power Amplifier at a frequency equal to $(f_{duplex} - f_{bb,TXoffset} - f_{bb,RXoffset})$, where the quantities $f_{bb,TXoffset}$ and $f_{bb,RXoffset}$ are the offsets from the center of the channel to the assigned resource blocks, could then produce spurious output lying on the wanted received signal. The potential for desensitization is increased since the transmitted energy is concentrated in the relatively narrow allocated channel, increasing the net overlap between the spurious output and the wanted signal. This displacement can be particularly challenging when the resulting range of sensitive frequencies overlaps the nominal switching frequency, or a low harmonic thereof, for a switched ET supply.

In the case where the Envelope Tracking power supply is a switched power supply, the output of the switched regulator is filtered by series inductor and shunt capacitor. At relevant frequencies, a corresponding simplified schematic is depicted in FIG. 3A. A switched ET supply is represented by a simplified noise model 310. The voltage source $V_{noise}$ represents the high-frequency noise produced within the switched converter. An output inductor $L_{out}$ and capacitor $C_{out}$ act as a double-pole filter at low frequencies, but at the higher frequencies of interest for duplex noise, the equivalent series inductance ESL and resistance ESR of the capacitor and printed circuit board routing must be considered. The transmission 320 to the power amplifier (treated as a resistance of about 25 ohms for frequencies well above the envelope tracking bandwidth) is depicted in FIG. 3B, for representative component values for a 3-5 MHz bandwidth envelope tracking system, appropriate for e.g. WCDMA or low-bandwidth LTE transmission. Note that the inductor $L_{out}$ includes a frequency-dependent loss term equivalent to about 0.15 ohms at low frequencies and 10 ohms at 100 MHz, representative of typical commercial surface-mount components. This loss term has modest effects on the predicted noise transfer function for the frequencies of interest. A maximum in transmission around 3 MHz results from the series resonance of $L_{out}$ and $C_{out}$, which may be useful in adapting the overall response of the envelope tracking power supply, and must in any case be accounted for in design of the control system. A broad minimum in transmission results from the low-Q series resonance of $C_{out}$ and ESL. For the value of ESR given in the figure, the minimum transmission is around −45 dB at 80 MHz, which may be insufficient to avoid receiver desensitization, depending on the emitted noise levels from the switched converter.

It is possible to insert an additional filter structure, such as a second series L-shunt C, a parallel L-C notch filter, or a more sophisticated multi-pole filter, between the envelope tracking power supply and the power amplifier branches. However, such a structures require additional components and board space. Each additional series inductance introduces additional losses, which degrade system efficiency, and each additional shunt capacitance increases losses in envelope tracking mode. The filter configuration must also ensure that the ET power supply presents a low impedance seen from the power amplifier, to ensure that current required by the varying RF output signal is available. In fixed-voltage configurations, a large decoupling capacitor, often several micro-Farads, is placed at each power amplifier supply input. As described in more detail below, such large capacitances result in unacceptable degradation of efficiency in envelope tracking operation.

It is therefore desirable to have methods and apparatuses for voltage regulation that provide both high efficiency envelope tracking and low paired-channel transmit noise, with minimal additional discrete components or printed circuit board space required.

SUMMARY

An embodiment includes a voltage supply apparatus. The voltage supply apparatus includes a voltage supply, a plurality of power amplifier (PA) decoupling circuits, and a plurality of power amplifiers. Each PA decoupling circuit is connected to the voltage supply and provides a filtered voltage supply to a corresponding one of the plurality of power amplifiers. Each PA decoupling circuit is configured to suppress noise of the provided filtered voltage supply below a threshold at one or more selected frequencies, wherein the suppression is provided by the PA decoupling circuit operating in conjunction with at least one other of the plurality of PA decoupling circuits.

Another embodiment includes a method of providing a plurality of filtered regulated voltages to a plurality of power amplifiers. The method includes generating a regulated voltage, and generating, by a plurality of decoupling circuits, the plurality of filtered regulated voltages, wherein each decoupling circuit provides a filtered regulated voltage to a corresponding one of the plurality power amplifiers, each decoupling circuit being configured to suppress noise of the provided filtered regulated voltage below a threshold at one or more selected frequencies, wherein the suppression is provided by the decoupling circuit operating in conjunction with at least one other of the plurality of decoupling circuits.

Other aspects and advantages of the described embodiments will become apparent from the following detailed description, taken in conjunction with the accompanying drawings, illustrating by way of example the principles of the described embodiments.

DETAILED DESCRIPTION

The embodiments described provide methods and apparatus for minimizing paired-channel noise using multiple power amplifiers driven by a single envelope-tracking power supply. One embodiment includes the selection of the component values of one of a plurality of power amplifier supply chains, so as to present a nearly zero impedance at a critical frequency of a different one of the plurality of power amplifier supply chains. In an embodiment, the critical frequency is the duplex frequency corresponding to the transmission band used by the different one of the plurality of power amplifiers. In an embodiment, the critical frequency represents a band of frequencies around the duplex frequency of the different one of the plurality of power amplifiers, where the width of the band of frequencies corresponds to the bandwidth resulting from modulation of the carrier transmitted by the different power amplifier.

Figure 1:
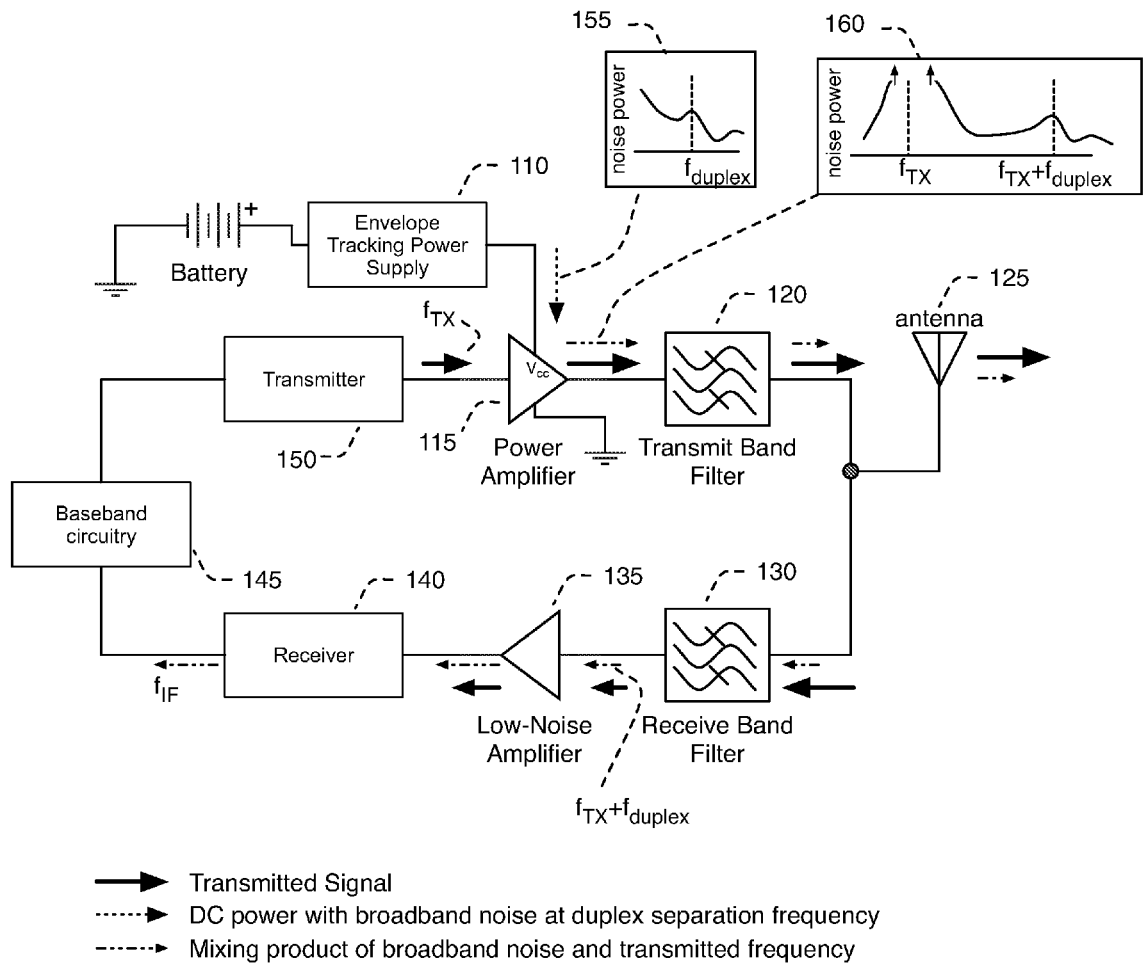
FIG. 1 shows a transmitter power amplifier and a Low-Noise receiver amplifier of a transceiver, in which the transmitter power amplifier is powered by an envelope tracking power supply.
Figure 4:
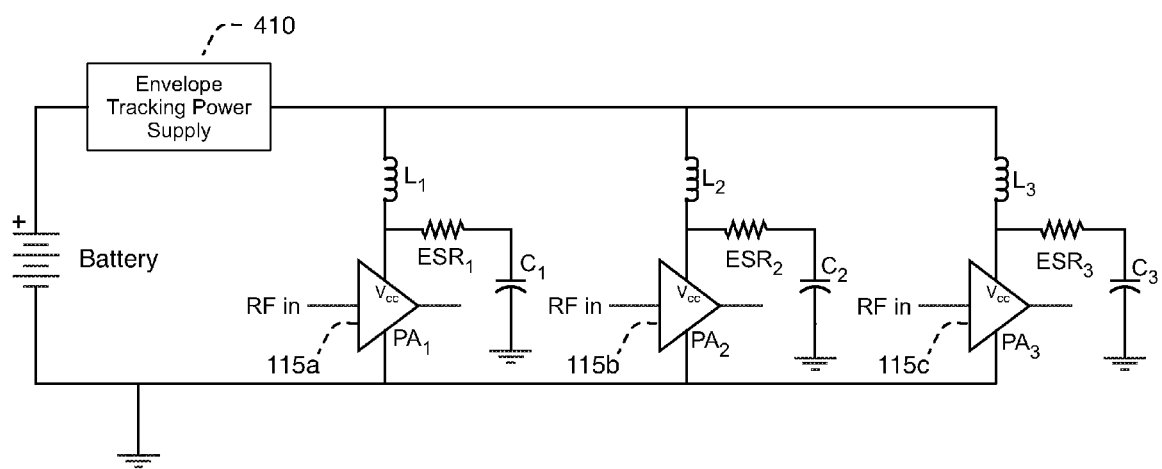
FIG. 4 shows a schematic of multiple power amplifiers of a transceiver, wherein each of the power amplifiers is powered by the envelope tracking power supply, according to an embodiment.

To minimize space, component cost, and power consumption, it is desirable to connect one ET supply to several power amplifiers, each responsible for operation in a different frequency band. FIG. 4 shows a schematic of multiple power amplifiers ($PA_1$ 115a, $PA_2$ 115b, $PA_3$ 115c) of a transceiver, wherein each of the power amplifiers is powered by the envelope tracking power supply 410, according to an embodiment. Each amplifier, such as $PA_1$ (115a) is presumed to be connected to local decoupling capacitance, here exemplified by $C_1$. Associated with the decoupling capacitance ($C_1$, $C_2$, $C_3$) is an equivalent series resistance, such as $ESR_1$, $ESR_2$, $ESR_3$; some inductance $L_1$, $L_2$, $L_3$ due to the configuration of the printed circuit board and power amplifier module connections is also present. Note that only three amplifiers are depicted in FIG. 4, but as many as five or more amplifiers may be encountered in a single mobile device. The input of each power amplifier, shown as RF in, is presumed to arise from a transmitter such as 150 of FIG. 1, and the output is directed through a filter or duplexer to the antenna.

While only one power amplifier is active at any given time, the input decoupling capacitance of all amplifiers is always connected, and must be charged or discharged when the output voltage changes. In a conventional fixed-supply-voltage amplifier, a large decoupling capacitor, from some hundreds of nanoFarad to several microFarad, may be placed at the supply voltage input of each power amplifier to filter noise and disturbances. For a nominally constant voltage source, no increase in dissipated power results. However, when the supply voltage varies, additional power consumption results from the presence of this capacitance because the total current delivered by the ET power supply must increase to charge the load capacitance to the desired voltage. In simplistic terms, the total decoupling capacitance may be regarded as being in parallel with an effective resistance corresponding to the envelope-controlled amplifier (since the amplifier current varies with RF amplitude, as does the envelope voltage provided by the ET supply). If the decoupling capacitance impedance is comparable to the effective resistance, the AC load current is increased by roughly a factor of $\sqrt{2}$, and consequent resistive power dissipation in the ET supply doubled. Therefore, when ET is used, it is of interest to minimize the added capacitance at each power amplifier, so that the total capacitive susceptance presented to the ET supply is at most comparable to the conductance of the active power amplifier. The capacitance to be minimized is the sum $$\sum_{i=1 \ldots n} (C_{PA,i} + C_{pck,i})$$

where the $i^{th}$ power amplifier has an external bypass capacitance $C_{PA,i}$ and internal capacitance (within the PA module) $C_{pck,i}$.

For example, consider the case where the power amplifier behaves approximately as a 5-ohm load within the envelope-tracking bandwidth. For a pseudorandom signal of bandwidth BW, spectral energy is roughly uniformly distributed from low frequencies to the band edge. To obtain a rough estimate of the impact of bypass capacitance, the capacitive susceptance can be computed at the intermediate frequency BW/2. Thus, for a 5 MHz bandwidth signal, a total capacitance of 12 nF would present a reactive susceptance of 5 ohms at 2.5 MHz. To ensure a mainly resistive load over the relevant bandwidth, the total decoupling capacitance should be limited to about 12 nF, or roughly 2.2 nF/amplifier in the case where 5 amplifiers are present. While this simple computation does not account for the complexity of a real pseudorandom signal spectrum, or additional dissipated power that is not quadratic in output current, it helps to clarify the role that decoupling capacitance plays in limiting the efficiency of an ET supply. Therefore the choice of component values for the module decoupling capacitances $C_{pck}$ and the board decoupling capacitances $C_{PA}$ are constrained by the requirement that the total capacitance be minimized. When Envelope Tracking is used, the traditional practice of placing large decoupling capacitances at each power amplifier cannot be used, but it is still necessary to minimize undesired noise coupling to the power supply connection of each PA, particularly at the frequencies that can result in undesired spurious output in the paired receive channels.

An exemplary design procedure for the described embodiments includes the following steps. In this exemplary procedure, and each of the examples that follow, three power amplifiers, such as 115a, 115b, and 115c, are depicted, but it is to be understood that the described embodiments apply to any configuration with two or more power amplifiers, with corresponding changes in the various filter structures depicted. First, a second small-value series inductor is added to the ET supply voltage after a main output inductor. The value of this inductor is selected to provide sufficient rejection, in combination with the branch resonances as described below. The upper bound on series inductor value is set by the additional resistive losses incurred, and by the increase in the output impedance of the supply, as seen by the power amplifiers, within the envelope tracking bandwidth. A typical range for the series inductor is on the order of 10% of the main inductor value. Second, decoupling capacitors are placed close to the supply connection for each power amplifier. The equivalent series inductance (ESL) of these capacitors must be minimized to ensure good decoupling (and consequent PA stability) at the RF operating frequency, typically 700 MHz or above. Third, the value of the decoupling capacitor for a first branch is selected, in conjunction with the inductance associated with routing from a power plane to that branch, to resonate at a frequency at which a second branch is sensitive, when the power amplifier of the second branch is active. Similarly, the value of the decoupling capacitor for a second branch is selected to resonate with its associated inductance at a frequency at which either the first branch, or a third branch (if present) is sensitive when active.

In an embodiment, the decoupling capacitors are placed in a multichip module with a power amplifier and control circuitry, mounted onto a printed-circuit board as a unit. In an alternative embodiment, decoupling capacitors may optionally be placed directly onto the printed circuit board, supplementing or replacing capacitors present within a multichip module. In this case, a single branch has multiple resonant frequencies, which must be accounted for in the design. In an alternative embodiment, discrete inductors are added to achieve the desired self-resonant frequency. For at least some embodiments, the branch filters are combined with additional conventional filtering, such as the aforementioned notch filters or multi-pole filters, which may be placed between the envelope tracking supply and the common supply node for all the power amplifier branches (the power plane), or between power amplifier branches.

Accordingly, an embodiment includes a voltage supply apparatus. The voltage supply apparatus includes a voltage supply, and a plurality of power amplifier (PA) decoupling circuits, each PA decoupling circuit connected to the voltage supply and providing a filtered voltage supply to a corresponding one of a plurality of power amplifiers, each PA decoupling circuit configured to suppress noise of the provided filtered voltage supply below a threshold at one or more selected frequencies, wherein the suppression is provided by the PA decoupling circuit operating in conjunction with at least one other of the plurality of PA decoupling circuits. For an embodiment, the voltage supply comprises a switching voltage regulator.

For an embodiment, the voltage supply is operable to support envelope tracking operation of one or more of the plurality of power amplifiers, wherein a voltage potential of the voltage supply is variable based on an instantaneous amplitude of an RF signal of the one or more of the plurality of power amplifiers.

For an embodiment, each PA decoupling circuit is operative to resonate at one or more predefined critical frequencies of at least one of the plurality of power amplifiers that do not correspond with the PA decoupling circuit. More specifically, for an embodiment each PA decoupling circuit comprises a real impedance at one or more of the predefined critical frequencies below a threshold, wherein the threshold is less than an impedance of another one of the plurality of PA decoupling circuits that corresponds with an active power amplifier.

For an embodiment, the one or more selected frequencies changes over time as a different one of the plurality of power amplifiers is selected for transmission. For an embodiment, each decoupling circuit is series resonant at a frequency important for another of the plurality of PA's. For an embodiment each decoupling circuit has a small pure real impedance at one or more frequencies within the sensitive band of another of the plurality of PA's, wherein small is less than the magnitude of the impedance of the active branch. For an embodiment, each active decoupling circuit of branch presents an admittance that has a magnitude small compared to the sum of the (inactive) branch admittances at a sensitive frequency of the active branch.

For an embodiment, only one of the plurality of power amplifiers is active at a time. More specifically, for an embodiment, the one or more selected frequencies include one or more duplex frequencies of a transmit channel of the one of the plurality of power amplifiers that is active.

In an alternative embodiment, two or more power amplifiers may be active simultaneously, as is required when a transmitter is used for multiple-input multiple-output (MIMO) communications, or when channels in different bands are aggregated and simultaneously assigned to a single mobile transmitter. In such an embodiment, the more selected frequencies include the duplex frequencies of the transmit channels of the power amplifiers that are active.

Figure 2A:
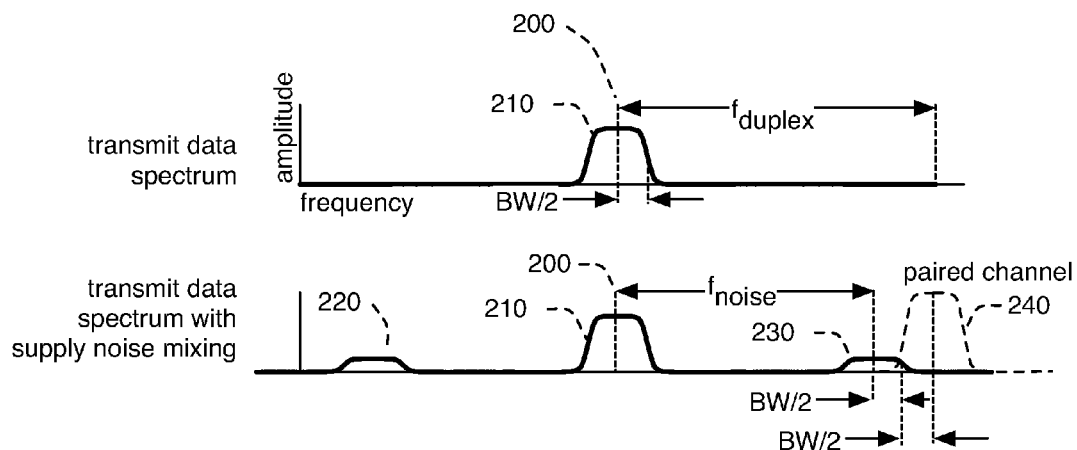
FIG. 2A shows a frequency domain that depicts an example, in which a receive channel is placed above a transmit channel by the duplex frequency $f_{duplex}$.
Figure 2B:
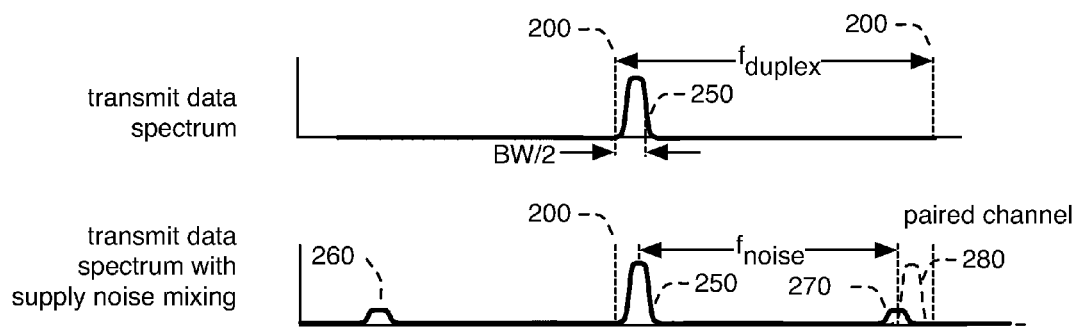
FIG. 2B shows another frequency domain that depicts an example wherein a resource block or blocks, centered above a nominal carrier, may be allocated to the mobile unit's transmitter, while a resource block or blocks centered below the nominal duplex carrier may be allocated to the same mobile unit's receiver.
Figure 3A:
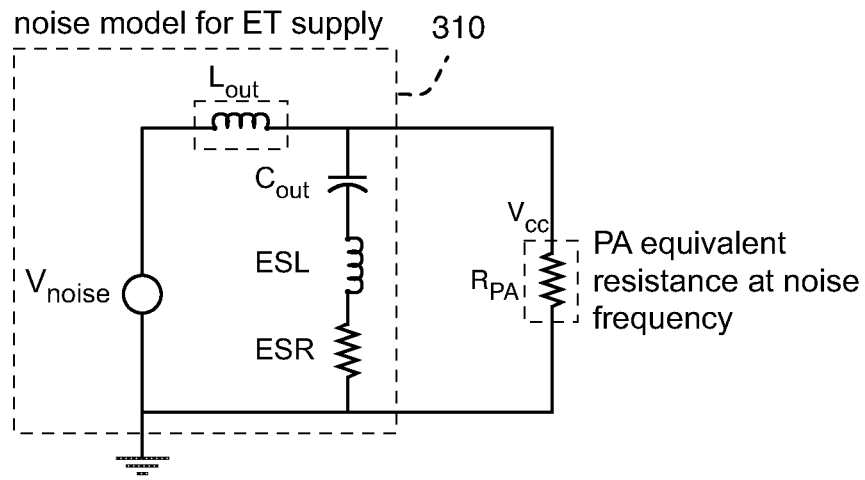
FIG. 3A shows an equivalent schematic for a switching power supply noise source connected to a single power amplifier.
Figure 3B:
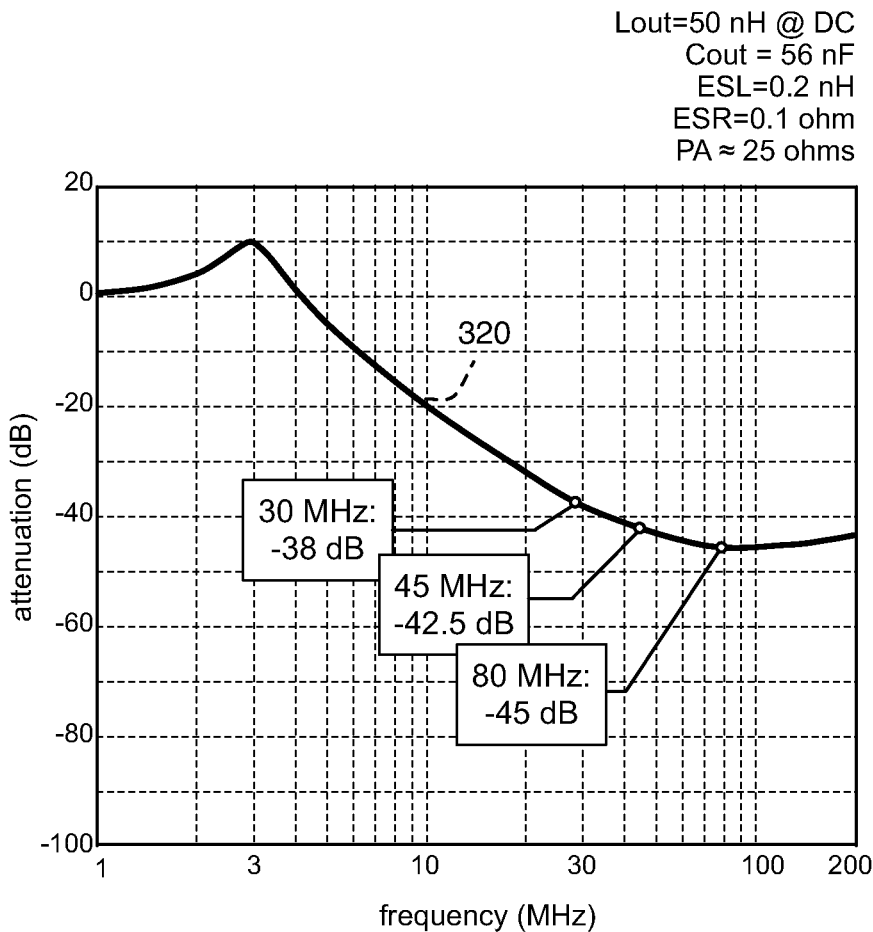
FIG. 3B shows a response of attenuation of the noise source at the equivalent power amplifier of FIG. 3A.

For an embodiment, the one or more selected frequencies include a band of frequencies centered on a duplex frequency of the different one of the plurality of power amplifiers than a power amplifier that correspond with the PA decoupling circuit, where a width of the band of frequencies corresponds to a bandwidth resulting from modulation of the carrier transmitted by the different one of the plurality of power amplifiers. It is to be understood that for at least some embodiments, resource blocks are allocated for a specific transmission reception so that the sensitive frequency range is not centered on the duplex frequency, as shown, for example, in FIG. 2.

Figure 5:
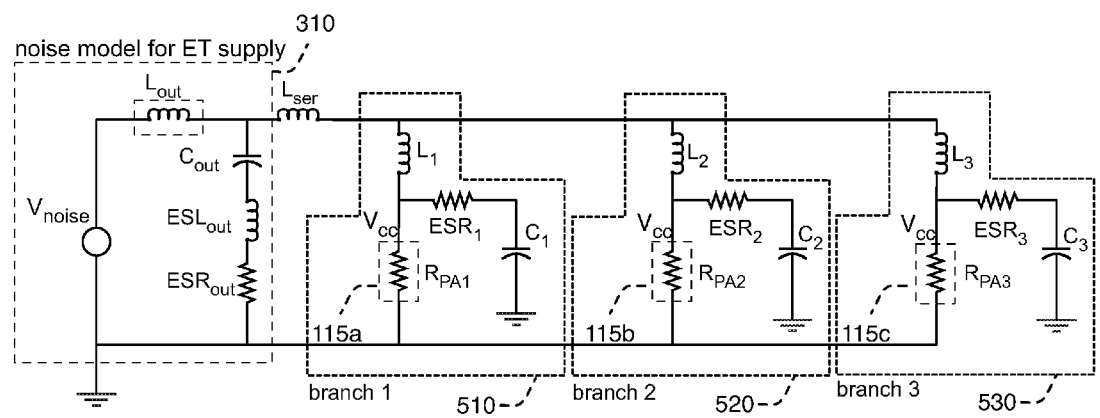
FIG. 5 shows a schematic of a switching converter envelope voltage supply that provides a voltage supply to RF power amplifiers, according to an embodiment.

For an embodiment, each of the PA decoupling circuits includes a decoupling capacitance (shown, for example, in FIG. 5 as decoupling capacitors $C_1$, $C_2$, $C_3$ of decoupling circuits 510, 520, 530). Further, a sum of the decoupling capacitances resonates with a series inductance (shown, for example, as $L_{ser}$ in FIG. 5, wherein $L_{ser}$ is a series inductance is at an output of the voltage supply). For this embodiment, a frequency of the resonance is below a second frequency, wherein the second frequency is set (or selected) based on a duplex frequency minus a bandwidth of a transmission signal passing through at least one of the one of the plurality power amplifiers. For an embodiment, the values of capacitance of the decoupling capacitors are selected to ensure that the frequency of the resonance is below the second frequency. For an embodiment, the value of inductance of the series inductance is selected to ensure that the frequency of the resonance is below the second frequency.

Another embodiment includes a method of providing a plurality of filtered regulated voltages to plurality of power amplifiers. The method includes generating a regulated voltage. For an embodiment, the regulated voltage is generated by a switching voltage regulator. The method further includes generating, by a plurality of decoupling circuits, the plurality of filtered regulated voltages, wherein each decoupling circuit provides a filtered regulated voltage to a corresponding one of plurality power amplifiers, each decoupling circuit configured to suppress noise of provided the filtered regulated voltage below a threshold at one or more selected frequencies, wherein the suppression is provided by the decoupling circuit operating in conjunction with at least one other of the plurality of decoupling circuits.

A First Exemplary Embodiment

A switched-converter envelope tracking supply is to drive three RF power amplifiers, allocated as depicted in Table 1. FIG. 5 shows an overall schematic of a switching converter envelope voltage supply that provides a voltage supply to RF power amplifiers, according to an embodiment. The power supply configuration is generally similar to that depicted in FIG. 4, except that an additional 4.5 nH series inductor $L_{ser}$ is present after the main inductor. The ET supply noise is represented by the same equivalent circuit 310. Three power amplifier branches 510, 520, and 530 are shown, each containing series inductance $L_1$, $L_2$, $L_3$ due to routing, equivalent series inductance of components, and optional additional discrete components, decoupling capacitance $C_1$, $C_2$, $C_3$, and equivalent series resistance $ESR_1$, $ESR_2$, $ESR_3$ of the routing and capacitor. Note that during operation, only one branch is active at any given time. For example, when branch 1 (510) is active, amplifier 115a is represented, for frequencies above the envelope tracking bandwidth, as a resistance $R_{PA1}$ of around 25 ohms for typical power amplifier configurations. The power amplifiers in inactive branches 520 and 530 are turned off and represented by a large resistance $R_{PA2,3} > 1$ k$\Omega$. The values of the resistors are modified appropriately to compute the noise transmission in each active branch in turn.

TABLE 1

Design Parameters for Example 1. The Band Numbers are based on the 3GPP Technical Specification 36.101, and the Frequencies are in MHz.

| Branch | Band Number | Transmit Frequency Range | Duplex Frequency |
|---|---|---|---|
| 1 | 5 | 824-849 | 45 |
| 2 | 2 | 1850-1910 | 80 |
| 3 | 17 | 704-716 | 30 |

Figure 6A:
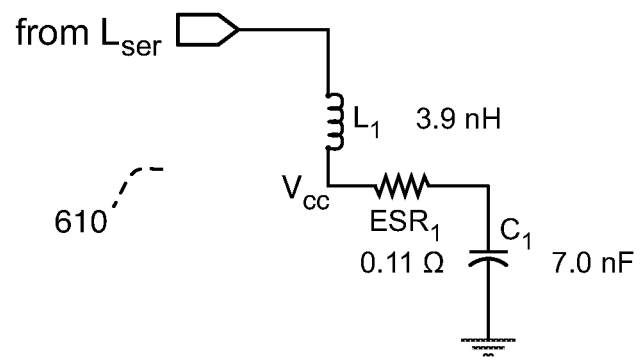
FIG. 6A shows a schematic of a branch of the decoupling circuits of the FIG. 5, according to an embodiment.
Figure 6B:
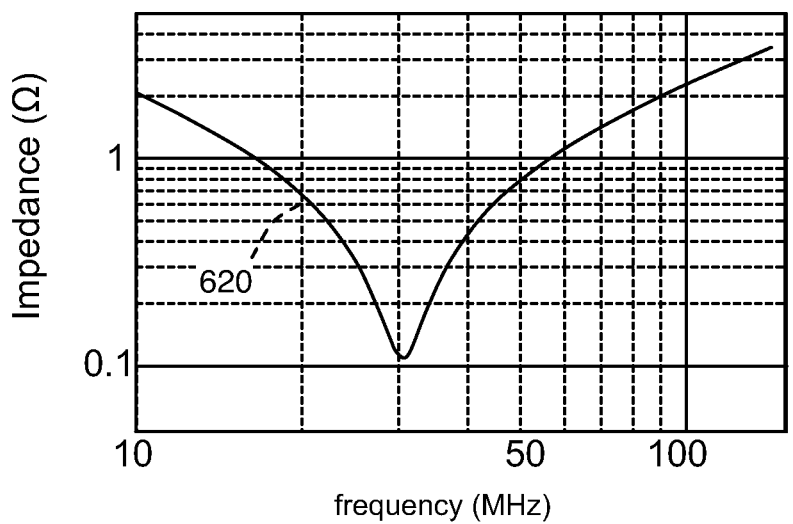
FIG. 6B shows impedance versus frequency for the branch of FIG. 6A, according to an embodiment.

Branch 1 is selected to provide a resonance at 30 MHz, reducing transmission to Branch 3 when the latter is active. FIG. 6A shows a schematic of a branch of the decoupling circuits of the FIG. 5, according to an embodiment. That is, FIG. 6A depicts the corresponding schematic for Branch 1 (610), with representative component values, where the resistance $R_{PA1}$ is large and thus has negligible effects on the branch impedance. FIG. 6B shows impedance versus frequency for the branch of FIG. 6A, according to an embodiment. The impedance vs. frequency for the circuit 610 is depicted as the graph 620. A minimum in impedance—a series resonance—is observed at about 30 MHz, as expected from the well-known relationship:

$$f_{res,1} = \frac{1}{2\pi\sqrt{L_1 C_1}}$$

In conjunction with the series impedance of the inductor $L_{ser}$, the low impedance of Branch 1 will reduce transmission of noise to Branch 3 at its duplex frequency of 30 MHz, when Branch 3 is active.

Component values for Branch 2 are similarly selected to resonate at 45 MHz, reducing noise transmission to Branch 1 at its duplex frequency. Branch 3 component values are selected to resonate at 80 MHz, reducing noise transmission to Branch 2 at its duplex frequency. The corresponding component values are summarized in Table 2. The impedance behavior of Branches 2 and 3 are similar to that of Branch 1, but translated in frequency.

TABLE 2

Branch component values for example 1.

| Branch | Inductance | Capacitance | Resistance | $f_{res}$ (MHZ) |
|---|---|---|---|---|
| 1 | $L_1$ = 3.9 nH | $C_1$ = 7 nF | $ESR_1$ = 0.1 $\Omega$ | 30 |
| 2 | $L_2$ = 2.8 nH | $C_2$ = 4.4 nF | $ESR_2$ = 0.09 $\Omega$ | 45 |
| 3 | $L_3$ = 2.3 nH | $C_3$ = 1.7 nF | $ESR_3$ = 0.07 $\Omega$ | 80 |

Figure 7:
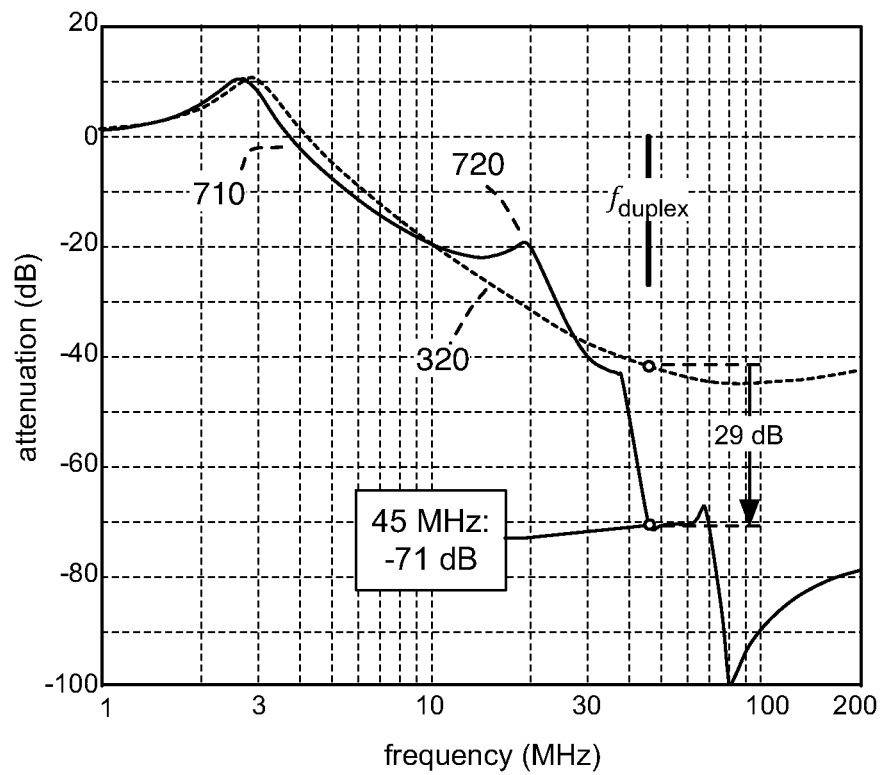
FIG. 7 shows a frequency response (attenuation versus frequency) for branch 1 of the decoupling circuits of FIG. 5, according to an embodiment.
Figure 8:
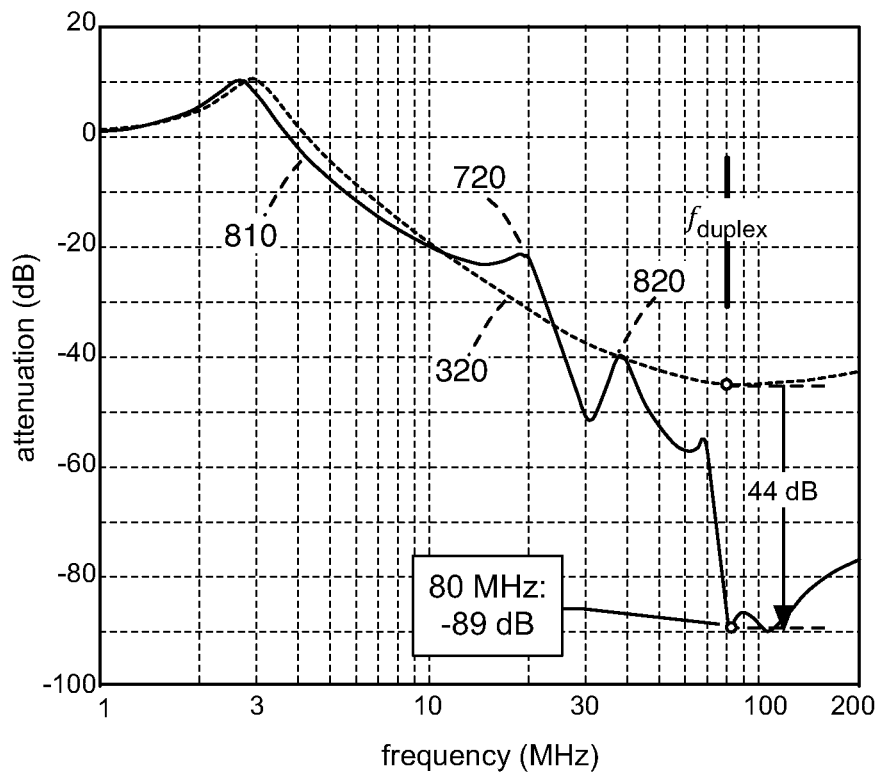
FIG. 8 shows a frequency response (attenuation versus frequency) for branch 2 of the decoupling circuits of FIG. 5, according to an embodiment.
Figure 9:
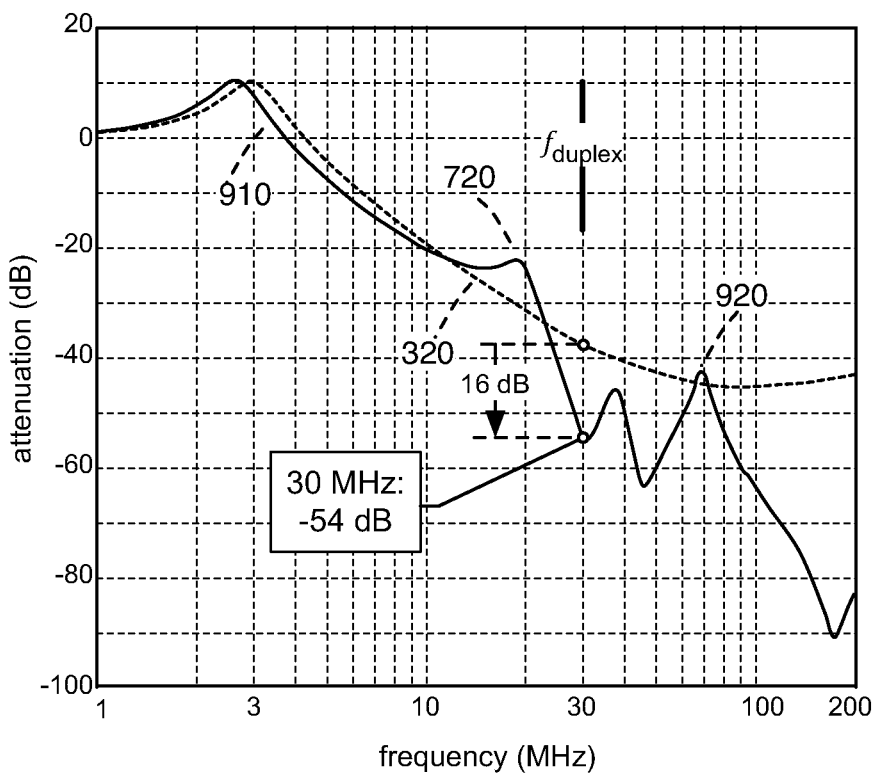
FIG. 9 shows a frequency response (attenuation versus frequency) for branch 3 of the decoupling circuits of FIG. 5, according to an embodiment.

FIG. 7 shows a frequency response (attenuation versus frequency) for branch 1 of the decoupling circuits of FIG. 5, according to an embodiment. FIG. 8 shows a frequency response (attenuation versus frequency) for branch 2 of the decoupling circuits of FIG. 5, according to an embodiment. FIG. 9 shows a frequency response (attenuation versus frequency) for branch 3 of the decoupling circuits of FIG. 5, according to an embodiment. Specifically, the resulting voltage transfer characteristic from the noise source to the equivalent PA input $V_{cc}$ for branches 1, 2, and 3 are depicted in FIG. 7, FIG. 8 and FIG. 9, respectively. As described above, in each case the active branch PA is represented by a resistance $R_{PA}$ of about 25 ohms, whereas the two inactive PA's are represented as large-value resistors. Each figure also depicts for reference transmission 320 for the case where only the output filter of the circuit 310 is present. In each case it is apparent that transmission to the active PA at its duplex frequency is reduced relative to that obtained by the main L-C output filter of the switched converter. For example, transmission 710 at 45 MHz is −71 dB, vs. −42 dB for transmission 320, an improvement of 29 dB. The corresponding improvement is roughly 44 and 16 dB for branches 2 and 3, respectively, as depicted in the corresponding FIGS. 8 and 9. It is apparent that substantial reductions in transmission, relative to that resulting from the simple L-C filter, are obtained at the duplex frequency of each branch, while using minimal added shunt capacitance.

The decoupling capacitors in each branch may be implemented as conventional surface-mount capacitors, and may be included within the multichip module containing the power amplifier, or placed on a printed circuit board adjacent to the power amplifier or PA module. The series inductance may be implemented using discrete inductors, but it is also possible and often advantageous to exploit the inevitable inductance of the printed circuit lines and vias between layers to provide part or all of the required inductance. In a typical printed circuit board, the supply lines are fabricated using copper 10-50 microns thick on a polymeric substrate, with a nearly-continuous copper ground plane bonded to the opposite surface of the polymer. In this case, a conductive line on the top surface acts as a microstrip transmission line. For line lengths much shorter than a wavelength, it can be shown that the impedance is approximately $$Z_{line} = \frac{j\omega Z_{char} l}{c}$$

$l$ = line length $Z_{char}$ = characteristic impedance of microstrip $c$ = velocity of light $\omega$ = angular frequency It is apparent that this impedance is that of an inductor of value $$L_{line} = \frac{Z_{char} l}{c}$$

For a typical line impedance of 50 ohms, the corresponding inductance will be about 1.7 nH/cm. Microstrip line impedance depends only logarithmically on the linewidth and dielectric thickness. A 50-ohm line on typical 14-mil (350 micron) thick FR4 layered board is about 0.7 mm wide, and has a resistance of roughly 10-20 milliohms per centimeter depending on frequency, so lines up to a couple of cm long, corresponding to about 4 nH, can be used without undue added loss. Practical layouts may employ a fairly low-inductance power plane, with via connections to the various power amplifiers, in which case part of the desired inductance may be provided from the distributed plane-via structure. Field simulation or empirical measurements may be required to establish the appropriate geometry for a desired equivalent inductance.

The joint action of the various branches needs to be accounted for in the design. In this example, a local maximum in transmission to all branches, 720, is apparent at about 20 MHz. This maximum arises from the series resonance of the series inductor $L_{ser}$ with the capacitive reactance of all the parallel branches. Previously, the capacitive reactance was assumed to be provided by the decoupling capacitors $C_1$, $C_2$, $C_3$ of the decoupling circuits. If the transmitted signals are sufficiently narrowband, this maximum will not cause a problem since it is below the lowest duplex frequency. However, if broadband signals, such as 10 MHz LTE, are to be transmitted, in-band noise could be encountered, and the 20-MHz resonance must be moved to a different frequency. For example, the value of inductance of the series inductor $L_{ser}$ may be increased, providing improved rejection at the cost of increased resistive losses, and increased output impedance of the supply, as seen by the power amplifiers.

At frequencies above the first branch series resonance, an additional mechanism for undesired enhancement in transmission is available. The impedance of at least one branch has become inductive, with positive imaginary part, while other branches remain capacitive, with impedances with negative imaginary parts. If the imaginary parts of the admittance (that is, the susceptance) of all the branches sum to 0, the branches present an effective parallel resonant load. Large currents may flow in individual branches while requiring only a small overall current from the series inductor. In the ideal lossless case, a simple analytic expression for the susceptance may be obtained:

$$B_{total} = \omega \sum_{branches} \frac{C_i}{\left(1 - \left[\frac{f}{f_{res,i}}\right]^2\right)} = 0 \text{ at resonance}$$

Figure 10:
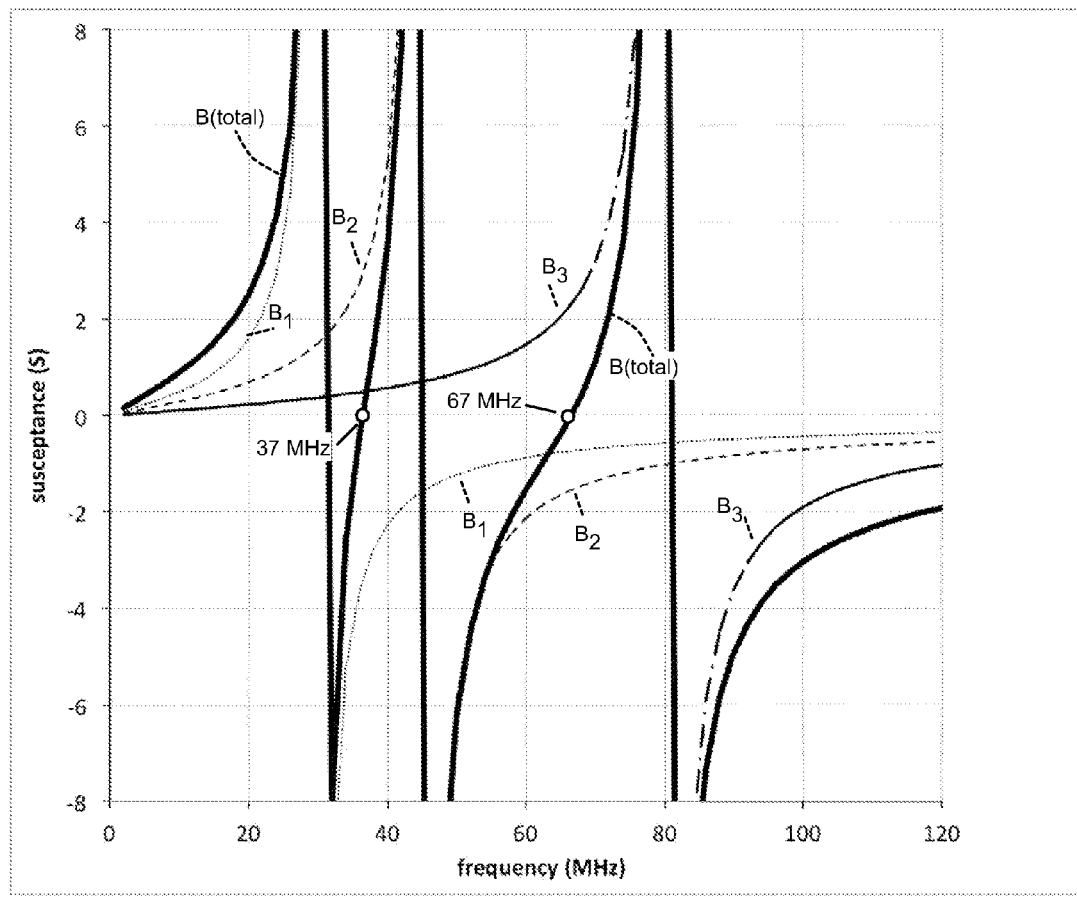
FIG. 10 is a plot that shows a susceptance of each of the branches of decoupling circuits, and the total susceptance for the values depicted in table 2.

A plot of this relationship for the values employed in Table 2 is depicted in FIG. 10. The total susceptance displays zeros at about 37 MHz (between the resonant frequencies of Branch 1 and Branch 2) and 67 MHz (between the resonant frequencies if Branch 2 and Branch 3). The corresponding features 820 and 920 are identified in FIG. 8 and FIG. 9 (and are visible, but more subtle, in FIG. 7). Empirical optimization of the selection of decoupling capacitor values may be made to shift these enhancements, and improve the bandwidth over which low transmission is obtained near the duplex or other sensitive frequencies.

It is to be appreciated that the schematic diagrams depicted in the example are simplified for clarity. A more complete representation of actual modules mounted on an actual printed circuit requires additional components representing various parasitic impedances, and will vary from one implementation to another. Detailed performance specifications are also highly dependent on the application. Thus, further empirical optimization of component values is generally required for best performance in a specific implementation, without departing from the embodiments as described.

A Second Exemplary Embodiment

The designer may not have complete freedom to adjust the positions of the impedance minima. In many practical cases, the power amplifier is contained within a module, whose design is predetermined by the manufacturer thereof. The combination of routing inductance on the board and routing inductance within the module may lead to a relatively high total inductance for a given capacitance value, so that the corresponding resonance is narrowband. Resonant frequencies may be compromised by layout constraints, so that only some of the sensitive frequencies may be removed by series resonances in the branches.

Figure 11:
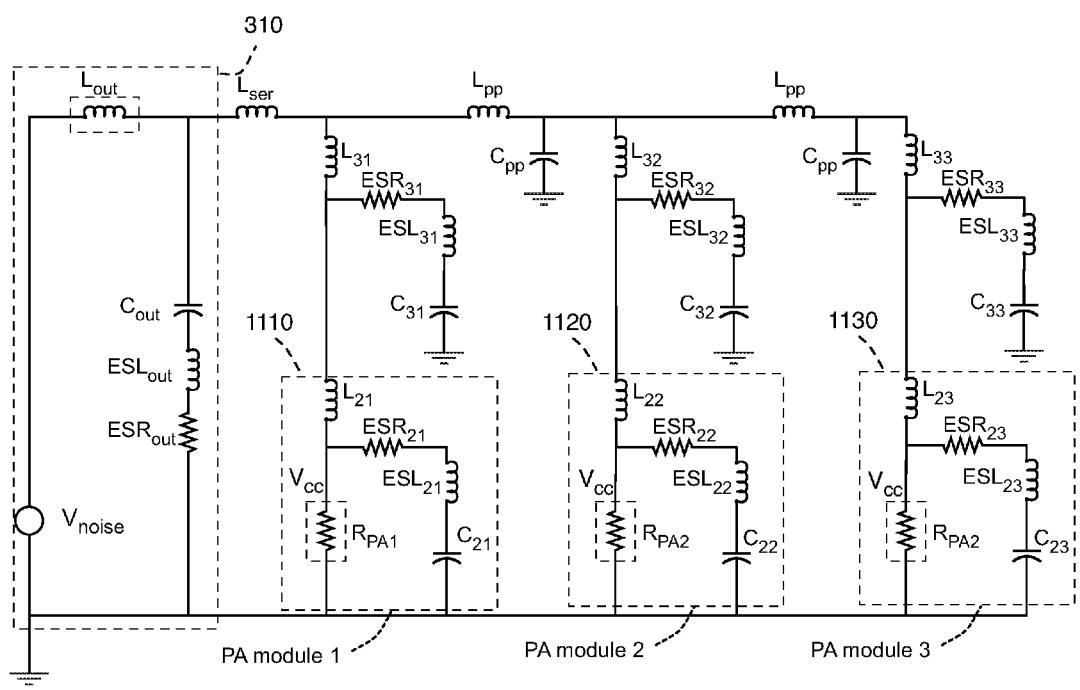
FIG. 11 shows an equivalent circuit for a multi-band power amplifier circuit using power amplifier modules, according to an embodiment.

FIG. 11 shows an equivalent circuit for a multi-band power amplifier circuit using power amplifier modules (PA module 1, PA module 2, PA module 3), according to an embodiment. Specifically, FIG. 11 depicts an example of a constrained design. The main output filter configuration is similar to that described in connection with FIG. 5, but each branch consists of a board-mounted decoupling capacitor $C_{3x}$, with associated ESL and ESR, a power amplifier module 1110, 1120, or 1130, with internal decoupling capacitor $C_{2x}$ and inductance $L_{2x}$, and routing inductance $L_{3x}$, where x=1,2 or 3 for Branches 1, 2, and 3 respectively. A small power-plane routing inductance $L_{pp}$ and capacitance $C_{pp}$ represent the parasitics associated with the power plane used to distribute supply voltage to the branches; the effect of the power plane is modest under 200 MHz.

Figure 12:
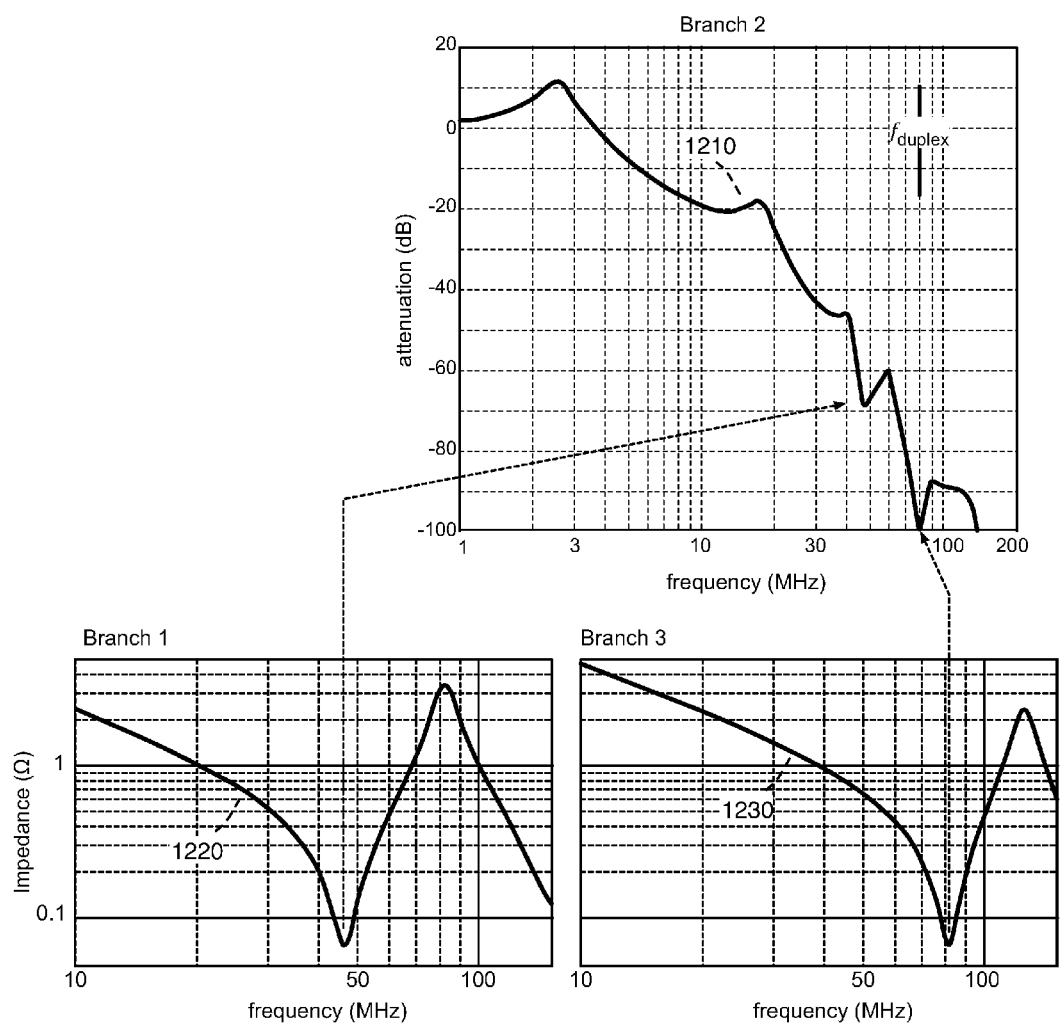
FIG. 12 shows a frequency response of the noise source of FIG. 11, to the branch 2 decoupling circuit, according to an embodiment.

FIG. 12 shows a frequency response of the noise source of FIG. 11, to the branch 2 decoupling circuit, according to an embodiment. Specifically, 1210 of FIG. 12 depicts the corresponding transmission from the noise source to branch 2 (Band 2, duplex frequency 80 MHz). Also depicted in the FIG. 12 are the impedances 1220 and 1230 looking into Branch 1 and Branch 3 respectively. The Branch 1 and Branch 3 power amplifiers are presumed to be inactive and represented as large resistances. The branch impedances contain an additional parallel resonance due to the interaction of the module decoupling capacitance and inductance with the board decoupling capacitance. The series resonance of Branch 1, at about 46 MHz, is clearly visible in the transmission to Branch 2 as a minimum at that frequency. Similarly, the series resonance of Branch 3, at about 81 MHz, is visible as a minimum in transmission to Branch 2. Similar behavior is noted with the other branches, although in this particular case Branch 1, which is series-resonant at 46 MHz, is populated with a Band 5 amplifier and thus is resonant at the duplex frequency. An additional notch filter may be needed for Band 5 operation, depending on the specifications of the application.

TABLE 3

Component values for the equivalent circuit of FIG. 11.

| Component | Value | Units | Remarks |
|---|---|---|---|
| $L_{out}$ | 50 | nH | Model includes frequency-dependent real impedance, 0.15 Ω at DC, ≈10 Ω @ 100 MHz |
| $C_{out}$ | 56 | nF | |
| $ESL_{out}$ | 0.2 | nH | |
| $ESR_{out}$ | 0.1 | Ω | Absolute transmission at high frequencies is sensitive to this value, which depends on layout and component selection |
| $L_{ser}$ | 4.5 | nH | |
| $L_{31}, L_{32}, L_{33}$ | 0.35 | nH | |
| $ESR_{31}$ | 0.1 | Ω | |
| $ESL_{31}, ESL_{32}, ESL_{33}$ | 0.2 | nH | |
| $C_{31}$ | 2.2 | nF | |
| $L_{21}, L_{22}, L_{23}$ | 0.5 | nH | |
| $ESR_{21}$ | 0.05 | Ω | |
| $ESL_{21}, ESL_{22}, ESL_{23}$ | 0.5 | nH | |
| $C_{21}$ | 4.2 | nF | |
| $ESR_{32}$ | 0.08 | Ω | |
| $C_{32}$ | 4.7 | nF | |
| $ESR_{22}$ | 0.07 | Ω | |
| $C_{22}$ | 7.1 | nF | |
| $ESR_{33}$ | 0.11 | Ω | |
| $C_{33}$ | 1.5 | nF | |
| $ESR_{23}$ | 0.07 | Ω | |
| $C_{23}$ | 1.7 | nF | |
| $L_{pp}$ | 0.1 | nF | |
| $C_{pp}$ | 10 | pF | |
| $R_{PA}$ (active branch) | 25 | Ω | |
| $R_{PA}$ (inactive branch) | 10 | kΩ | |

When possible, it is preferable to minimize the capacitance values within the module (e.g. to 1 nF or less), so that the corresponding resonances are at much higher frequencies than the duplex or other sensitive frequencies. The decoupling capacitors on the board can then be freely chosen to provide relatively broad resonances at the desired frequencies, while using the smallest possible total branch capacitance.

In cases like the second exemplary embodiment, where module capacitances are larger than optimal for Envelope Tracking applications, the board designer may add large-value board-mounted decoupling capacitor to provide a second resonance close to a sensitive frequency, such that the two resonances combined provide reduced noise transmission over a reasonably broad band. Since the inductance associated with the board decoupling capacitor is smaller than that to the module, a larger capacitance value must be used on the board for the same resonant frequency. The total capacitance of the branches is increased, and envelope tracking efficiency is reduced.

Although specific embodiments have been described and illustrated, the embodiments are not to be limited to the specific forms or arrangements of parts so described and illustrated.

What is claimed:

1. A voltage supply apparatus, comprising:
a voltage supply; and
a plurality of power amplifier (PA) decoupling circuits, each PA decoupling circuit connected to the voltage supply and providing a filtered voltage supply to a corresponding one of a plurality power amplifiers, each PA decoupling circuit configured to suppress noise of the provided filtered voltage supply below a threshold at one or more selected frequencies, wherein the suppression is provided by the PA decoupling circuit operating in conjunction with at least one other of the plurality of PA decoupling circuits; wherein
each PA decoupling circuit is operative to resonate at one or more predefined critical frequencies of at least one of the plurality of power amplifiers that do not correspond with the PA decoupling circuit; wherein
the one or more selected frequencies include a band of frequencies centered on a duplex frequency of the different one of the plurality of power amplifiers than a power amplifier that correspond with the PA decoupling circuit, where a width of the band of frequencies corresponds to a bandwidth resulting from modulation of the carrier transmitted by the different one of the plurality of power amplifiers.

2. The apparatus of claim 1, wherein the voltage supply is operable to support envelope tracking operation of one or more of the plurality of power amplifiers, wherein a voltage potential of the voltage supply is variable based on an instantaneous amplitude of an RF signal of the one or more of the plurality of power amplifiers.

3. The apparatus of claim 1, wherein each PA decoupling circuit comprises a real impedance that is below a threshold at one or more of the predefined critical frequencies, wherein the threshold is less than an impedance of another one of the plurality of PA decoupling circuits that corresponds with an active power amplifier.

4. The apparatus of claim 1, wherein the one or more selected frequencies changes over time as a different one of the plurality of power amplifiers is selected for transmission.

5. The apparatus of claim 1, wherein only one of the plurality of power amplifiers is active at a time.

6. The apparatus of claim 5, wherein the one or more selected frequencies include one or more duplex frequencies of a transmit channel of the one of the plurality of power amplifiers that is active.

7. The apparatus of claim 1, wherein the voltage supply comprises a switching voltage regulator.

8. The apparatus of claim 7, wherein the one or more selected frequencies comprises a fundamental frequency or a harmonic frequency of a switching frequency of the switching voltage regulator.

9. A voltage supply apparatus, comprising:
a voltage supply; and
a plurality of power amplifier (PA) decoupling circuits, each PA decoupling circuit connected to the voltage supply and providing a filtered voltage supply to a corresponding one of a plurality power amplifiers, each PA decoupling circuit configured to suppress noise of the provided filtered voltage supply below a threshold at one or more selected frequencies, wherein the suppression is provided by the PA decoupling circuit operating in conjunction with at least one other of the plurality of PA decoupling circuits; wherein each PA decoupling circuit is operative to resonate at one or more predefined critical frequencies of at least one of the plurality of power amplifiers that do not correspond with the PA decoupling circuit; wherein each of the PA decoupling circuits comprises a decoupling capacitor, and wherein a sum of the decoupling capacitors resonates with a series inductance, wherein a frequency of the resonance is below a second frequency, wherein the second frequency is set based on a duplex frequency minus a bandwidth of a transmission signal passing through at least one of the one of the plurality power amplifiers, and wherein the series inductance is at an output of the voltage supply.

10. A method of providing a plurality of filtered regulated voltages to plurality of power amplifiers, comprising:

generating a regulated voltage;

generating, by a plurality of decoupling circuits, the plurality of filtered regulated voltages, wherein each decoupling circuit provides a filtered regulated voltage to a corresponding one of plurality power amplifiers, each decoupling circuit configured to suppress noise of the provided filtered regulated voltage below a threshold at one or more selected frequencies, wherein the suppression is provided by the decoupling circuit operating in conjunction with at least one other of the plurality of decoupling circuits; wherein each decoupling circuit is operative to resonate at one or more predefined critical frequencies of at least one of the plurality of power amplifiers that do not correspond with the decoupling circuit; and wherein the one or more selected frequencies include a band of frequencies centered on a duplex frequency of the different one of the plurality of power amplifiers than a power amplifier that correspond with the PA decoupling circuit, where a width of the band of frequencies corresponds to a bandwidth resulting from modulation of the carrier transmitted by the different one of the plurality of power amplifiers.

11. The method of claim 10, wherein regulated voltage is operable to support envelope tracking operation of one or more of the plurality of power amplifiers.

12. The method of claim 10, wherein each decoupling circuit comprises a real impedance that is below a threshold at one or more of the predefined critical frequencies, wherein the threshold is less than an impedance of another one of the plurality of decoupling circuits that corresponds with an active power amplifier.

13. The method of claim 10, wherein the one or more selected frequencies changes over time as a different one of the plurality of power amplifiers is selected for transmission.

14. The method of claim 10, wherein only one of the plurality of power amplifiers is active at a time.

15. The method of claim 14, wherein the one or more selected frequencies include one or more duplex frequencies of a transmit channel of the one of the plurality of power amplifiers that is active.

16. The method of claim 10, wherein the voltage supply comprises a switching voltage regulator.

17. A mobile device, comprising:

a plurality of power amplifiers;

a voltage regulator;

a plurality of power amplifier (PA) decoupling circuits, each PA decoupling circuit connected to the voltage regulator and providing a filtered voltage supply to a corresponding one of the plurality power amplifiers, each PA decoupling circuit configured to suppress noise of provided filtered voltage supply below a threshold at one or more selected frequencies, wherein the suppression is provided by the PA decoupling circuit operating in conjunction with at least one other of the plurality of PA decoupling circuits; wherein each PA decoupling circuit is operative to resonate at one or more predefined critical frequencies of at least one of the plurality of power amplifiers that do not correspond with the PA decoupling circuit; wherein the one or more selected frequencies include a band of frequencies centered on a duplex frequency of the different one of the plurality of power amplifiers than a power amplifier that correspond with the PA decoupling circuit, where a width of the band of frequencies corresponds to a bandwidth resulting from modulation of the carrier transmitted by the different one of the plurality of power amplifiers.

18. The mobile device of claim 17, wherein the voltage regulator is operable to support envelope tracking operation of one or more of the plurality of power amplifiers, wherein a voltage potential of the voltage regulator is variable based on an instantaneous amplitude of an RF signal of the one or more of the plurality of power amplifiers.

* * * * *